(12) United States Patent
Hirata

(10) Patent No.: US 6,629,049 B2
(45) Date of Patent: *Sep. 30, 2003

(54) METHOD FOR NON-HARMONIC ANALYSIS OF WAVEFORMS FOR SYNTHESIS, INTERPOLATION AND EXTRAPOLATION

(75) Inventor: Yoshimutsu Hirata, Tokyo (JP)

(73) Assignee: Hirata Wave Analysis, Inc., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/810,195

(22) Filed: Mar. 3, 1997

(65) Prior Publication Data

US 2002/0032536 A1 Mar. 14, 2002

(51) Int. Cl.[7] .............................................. G06F 17/00
(52) U.S. Cl. .............................. 702/70; 702/66; 702/74
(58) Field of Search ........................ 702/66, 67, 69–71, 702/73–77, 79, 106, 126–129, 176, 189, 190, 194, 195, 191, 193, FOR 103–FOR 110, FOR 166, FOR 168, FOR 170, FOR 171; 364/724.06–724.08, 725.01–725.03, 726.01–726.03, 808, 810, 817, 826, 827, 724.03, 724.19; 704/203–205, 211, 220; 333/165, 166

(56) References Cited

U.S. PATENT DOCUMENTS

| 3,824,384 A | * | 7/1974 | Murata et al. ......... 364/724.03 |
| 4,334,273 A | * | 6/1982 | Ikeda ........................... 702/74 |
| 4,499,550 A | * | 2/1985 | Ray, III et al. ............... 702/75 |
| 4,614,909 A | * | 9/1986 | Järvfält ........................ 702/75 |

FOREIGN PATENT DOCUMENTS

WO    WO 94/18573    8/1994

\* cited by examiner

*Primary Examiner*—Hal Wachsman
(74) *Attorney, Agent, or Firm*—Jones, Tullar & Cooper, P.C.

(57) ABSTRACT

A method according to which a discrete waveform is multiplied by a sine function having an arbitrary period. The product is summed over a selected interval to derive a first summation and multiplied by a cosine function having the same period and the product is summed over the interval to provide a second summation. The sine and cosine functions are multiplied together and the product is summed over the interval to provide a third summation. The sine function is squared and summed over the interval to provide a fourth summation. Similarly, the cosine function is squared and summed over the interval to provide a fifth summation. Based on the five values, sinusoids contained in the discrete waveform are detected by subtracting each sinusoid from the discrete waveform to provide an associated residual waveform and detecting each residual waveform whose power is a local minimum as a result of varying the period.

3 Claims, 9 Drawing Sheets

FIG. 3(a)
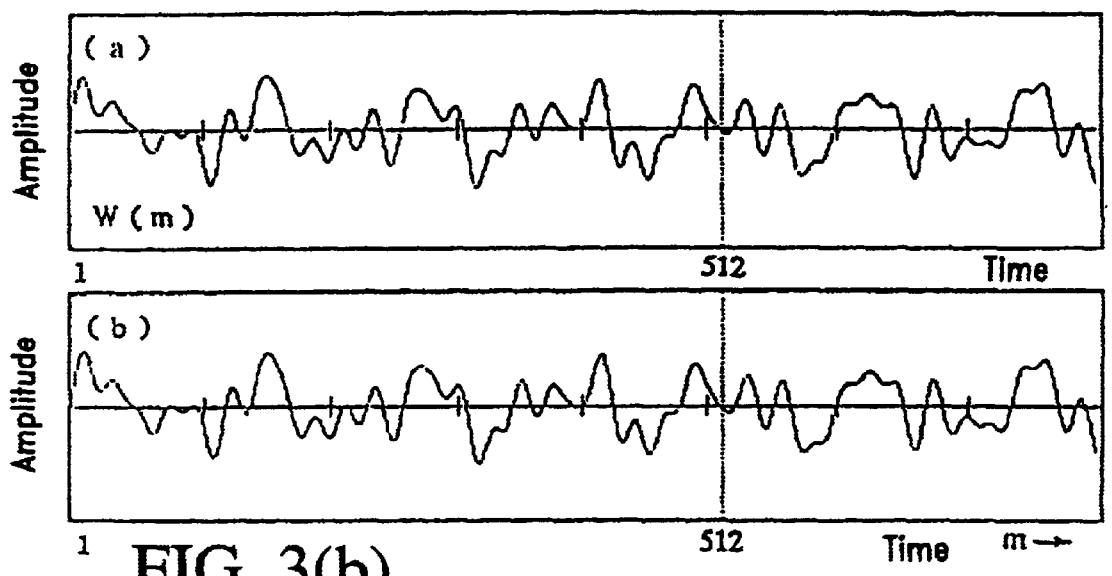
FIG. 3(b)
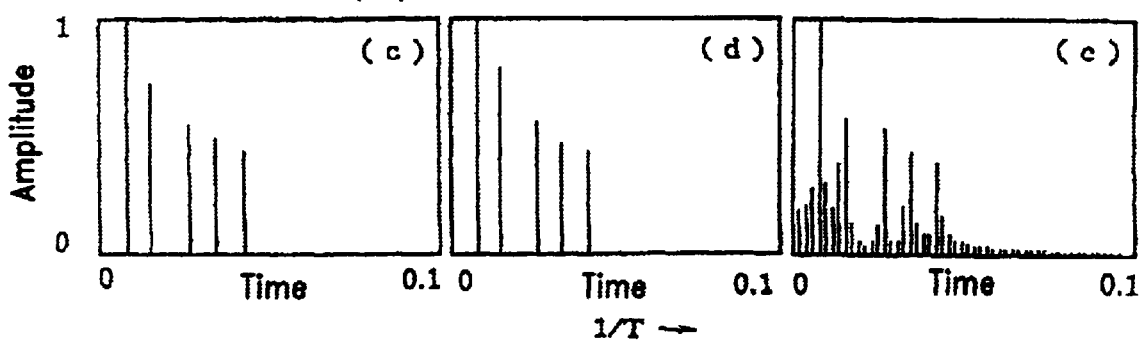
FIG. 3(c)   FIG. 3(d)   FIG. 3(e)

FIG. 4(a)
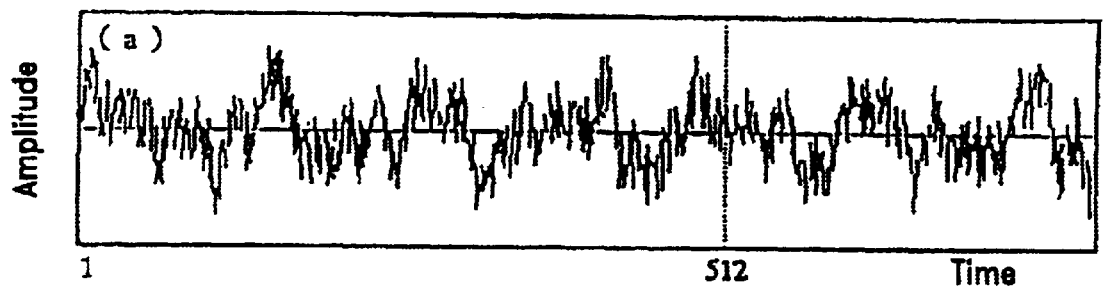
FIG. 4(b)
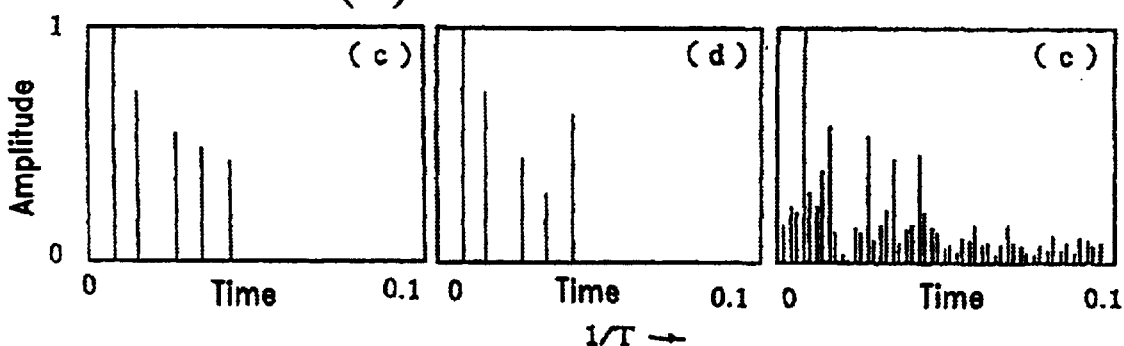
FIG. 4(c)   FIG. 4(d)   FIG. 4(e)

US 6,629,049 B2

METHOD FOR NON-HARMONIC ANALYSIS OF WAVEFORMS FOR SYNTHESIS, INTERPOLATION AND EXTRAPOLATION

CROSS REFERENCE TO RELATED APPLICATION

This application discloses subject matter which is related to the subject matter disclosed in application Ser. No. 08/495,675, filed on Oct. 4, 1995 and now U.S. Pat. No. 5,862,516.

BACKGROUND OF THE INVENTION (a) Field of the Invention

This invention relates to a method for waveform analysis, and more particularly, to an improved method for non-harmonic analysis of waveforms in which intervals and/or frequencies (or periods) for analysis can be selected in an arbitrary manner. More particularly, the invention concerns such method which finds utility in a wide variety of applications that require waveform processing, such as interpolation of a waveform with missing portions, restoration of a clipped (or saturated) waveform, waveform prediction, processing of image and sound signals, determination of the pitch period of a harmonic waveform and the like.

(b) Description of the Prior Art

Heretofore, various methods for waveform analysis have been proposed for purposes of waveform synthesis, noise suppression, bandwidth compression and the like. Those previous methods are exemplified by Applicant's PCT Application No. PCT/JP94/00146 which was published on Aug. 18, 1994 under International Publication No. WO 94/18573. As is well known, the Fourier analysis is typical of the harmonic analysis to be applied to one continuous section of a waveform, and the Fourier transform such as DFT and FFT is represented by a number of sinusoids having a harmonic relationship. Accordingly, the waveform resulting from the inverse Fourier transform is a repetition of the particular internal of the original waveform and does not provide any information for other sections of the waveform. The general harmonic analysis known as Prony's method provides for detection of sinusoids which actually constitute a waveform to be analyzed and, in principle, permits a restoration and prediction of the waveform through waveform synthesis. However, the method has not been put into practical use because the number of sinusoids constituting the waveform must be known and also because the method is susceptible to influences by noises.

SUMMARY OF THE INVENTION

It is a general object of the invention to provide an improved method for non-harmonic waveform analysis which permits freedom of selecting intervals and/or frequencies (or periods) for analysis.

It is another object of the invention to provide an improved method for non-harmonic waveform analysis that is less susceptible to influences by noises than the prior art.

It is a further object of the invention to provide an improved method for non-harmonic waveform analysis which can be used for interpolation, extrapolation or prediction of waveforms.

Accordingly, the invention is generally directed to a method for making a non-harmonic frequency analysis of a discrete waveform, comprising: multiplying an arbitrary interval of a discrete waveform to be analyzed by a sine function having an arbitrary period to provide a first product value; summing the first product value over the arbitrary interval to provide a first summation value; multiplying the arbitrary interval of the discrete waveform by a cosine function having the arbitrary period to provide a second product value; summing the second product value over the arbitrary interval to provide a second summation value; multiplying the sine function and the cosine function to provide a third product value;

summing the third product value over the arbitrary interval to provide a third summation value; squaring the sine function to provide a fourth square value; summing the fourth square value over the arbitrary interval to provide a fourth summation value; squaring the cosine function to provide a fifth square value; summing the fifth square value over the arbitrary interval to provide a fifth summation value; and deriving a plurality of sinusoids contained in the discrete waveform based on the first to fifth summation values.

BRIEF DESCRIPTION OF DRAWINGS

A preferred embodiment of the present invention will be hereinafter described with reference to the examples illustrated by the accompanying drawings, in which:

FIG. 1(*b*) shows another waveform to be analyzed having its positive and negative peaks clipped;

FIGS. 3(*a*), 3(*b*), 3(*c*), 3(*d*) and 3(*e*) show the results of analyzing and synthesizing a waveform in accordance with the present invention;

FIGS. 4(*a*), 4(*b*), 4(*c*), 4(*d*) and 4(*e*) show the results of analyzing a noise-ridden waveform and synthesizing the original waveform so as to remove such noise according to the present invention;

DESCRIPTION OF PREFERRED EMBODIMENTS

Figure 1A:
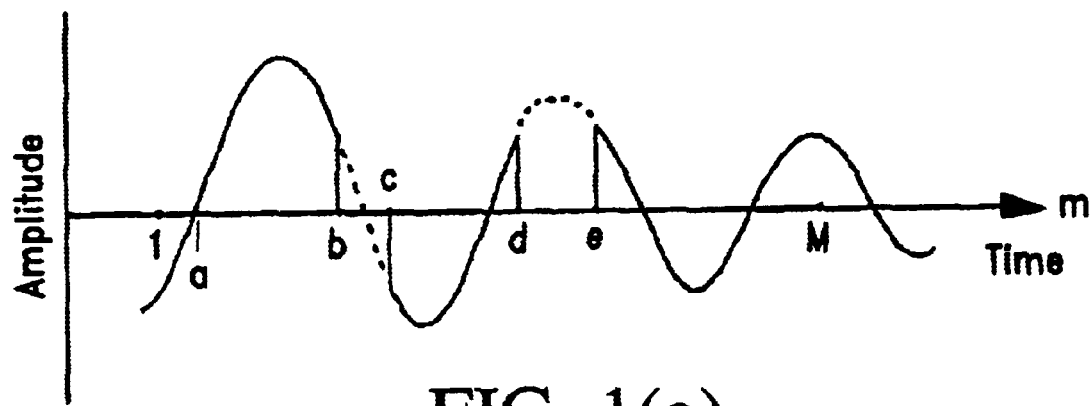
FIG. 1(*a*) shows a waveform to be analyzed that is discontinuous in that it lacks data in sections b to c and d to e.

Before proceeding with a detailed description of preferred embodiments, an explanation of the principles of operation of the present invention using mathematical expressions will be in order.

Assuming that a waveform to be analyzed, as shown in FIG. 1(*a*) or 1(*b*), is represented by wave data W(m)(m=1, 2, . . . M), the W(m) is multiplied by a sine function having an arbitrary period, T. The product is then summed over an arbitrary interval R to derive a summation, p(T):

$$p(T) = \sum_R W(m)\sin(2\pi m/T) \quad \text{Equation 1}$$

The wave data W(m) is also multiplied by a cosine function having the arbitrary period T, and the product is summed over the arbitrary interval R to derive a summation, q(T):

$$q(T) = \sum_R W(m)\cos(2\pi m/T) \quad \text{Equation 2}$$

The sine and cosine functions both having the period T are multiplied together, and the product is summed over the arbitrary interval R to derive a summation, D(T):

$$D(T) = \sum_R \sin(2\pi m/T)\cos(2\pi m/T) \quad \text{Equation 3}$$

The sine function having the period T is squared and summed over the arbitrary interval R to derive a summation, A(T):

$$A(T) = \sum_R [\sin(2\pi m/T)]^2 \quad \text{Equation 4}$$

The cosine function having the period T is squared and summed over the arbitrary interval R to derive a summation, B(T):

$$B(T) = \sum_R [\cos(2\pi m/T)]^2 \quad \text{Equation 5}$$

In the above equations, it should be noted that if, for example, the interval R is continuous in three segments, i.e., m=a to b; c to d; and e to f, the summation of each of the above equations is given as the sum of the three segments a to b; c to d; and e to f, as follows:

$$\sum_R = \sum_{m=a}^{b} + \sum_{m=c}^{d} + \sum_{m=e}^{f} \quad \text{Equation 6}$$

The amplitudes, X(T) and Y(T), of the sine and cosine functions, respectively, as defined by the above five summation values, are:

$$X(T) = \{B(T)p(T) - D(T)q(T)\}/\{A(T)B(T) - [D(T)]^2\}$$
$$Y(T) = \{A(T)q(T) - D(T)p(T)\}/\{A(T)B(T) - [D(T)]^2\} \quad \text{Equations 7}$$

And, a sinusoid, S(m, T), contained in the internal R of the wave data W(m) is:

$$S(m, T) = X(T)\sin(2\pi m/T) + Y(T)\cos(2\pi m/T) \quad \text{Equation 8}$$

Accordingly, a residual waveform, R(m; T), is:

$$R(m; T) = W(m) - X(T)\sin(2\pi m/T) - Y(T)\cos(2\pi m/T) \quad \text{Equation 9}$$

Thus, a residual quantity, E(T) is:

$$E(T) = \sum_R [R(m; T)]^2 \quad \text{Equation 10}$$
$$= W - X(T)p(T) - Y(T)q(T)$$

where w=the sum of squared W(m) over the interval R.

Here, it is assumed that the wave data W(m) can be expressed by a single sine function, as follows:

$$W(m) = K_1 \sin(2\pi m/T_1 + \Theta_1) \quad \text{Equation 11}$$

The following equations hold:

$$X(T_1) = K_1 \cos(\Theta_1)$$
$$Y(T_1) = K_1 \sin(\Theta_1) \quad \text{Equations 12}$$

In this case, the residual quantity is equal to zero. Here, it is assumed that the wave data W(m) can be expressed by the summation of a plurality of sine functions as follows:

$$W(m) = K_1 \sin(2\pi m/T_1 + \Theta_1) + \quad \text{Equation 13}$$
$$K_2 \sin(2\pi m/T_2 + \Theta_2) + K_3 \sin(2\pi m/T_3 + \Theta_3) + \ldots$$

If the length of the interval R is sufficiently greater than the periods of the sine functions, and also $K_1 > K_2 > K_3 > \ldots$ or $K_1 \approx K_2 \approx K_3 \approx \ldots$, $$X(T_1) \simeq K_1 \cos(\Theta_1) + d_1/A(T_1) \quad \text{Equations 14}$$
$$Y(T_1) \simeq K_1 \sin(\Theta_1) + d_2/B(T_1)$$
$$d_1 = \sum_R \sin(2\pi m/T_1)\{K_2 \sin(2\pi m/T_2 + \Theta_2) +$$
$$K_3 \sin(2\pi m/T_3 + \Theta_3) + \ldots\}$$
$$d_2 = \sum_R \cos(2\pi m/T_1)\{K_2 \sin(2\pi m/T_2 + \Theta_2) +$$
$$K_3 \sin(2\pi m/T_3 + \Theta_3) + \ldots\}$$

In the above equations, $d_1$ and $d_2$ are quantities which vary with m but have an average equal to zero. On the other hand, $A(T_1)$ and $B(T_1)$ are both evenly increasing functions with their asymptotic curves expressed by $K_1$ m/2. Accordingly, if the interval is sufficiently great, $T=T_1$ or $T \approx T_1$, and the E(t) becomes a local minimum. Thus, by using $X(T_1)$ and $Y(T_1)$, the following approximation to the sine waveform as expressed by the first term of the right side of Equation 13 is given:

$$K_1 \sin(2\pi m/T_1 + \Theta_1) \simeq \quad \text{Equation 15}$$
$$X(T_1)\sin(2\pi m/T_1) + Y(T_1)\cos(2\pi m/T_1) = S(m, T_1)$$

Generally, if it is possible to detect sinusoids comprising the wave data, such as those expressed by Equation 13, E(T) is a local minimum when $T=T_1, T_2, T_3, \ldots$ or $T \approx T_1, T_2, T_3, \ldots$. Accordingly, a first residual waveform, $R(m; T_1)$, is derived by subtracting a first sinusoid, $S(m, T_1)$, as expressed by the right side of Equation 15 from W(m). Then, by replacing the W(m) in Equations 1 and 2 with R(m; $T_1$), a second sinusoid, S(m, $T_2$), is derived from R(m; $T_1$) just like S(m, $T_1$) is derived from W(m), and a second residual waveform, R(m; $T_1$, $T_2$) is derived by subtracting the second sinusoid S(m, $T_2$) from R(m; $T_1$). In a like manner, an n-th sinusoid, S(m, $T_n$), can generally be derived from an (n−1)th residual waveform, R(m; $T_1$, $T_2$, ..., $T_{n-1}$).

It should be noted that the following orthogonal relationship exists between a k-th residual waveform, R(m; $T_1$, $T_2$, ..., $T_k$), and a k-th sinusoid, S(m, $T_k$), as derived during the described analysis:

$$\sum_R R(m; T_1, T_2, \ldots, T_k) S(m, T_k) = 0 \qquad \text{Equation 16}$$

The present invention will be described in detail in the context of interpolating a discontinuous waveform and then of restoring a clipped waveform.

Figure 1B:
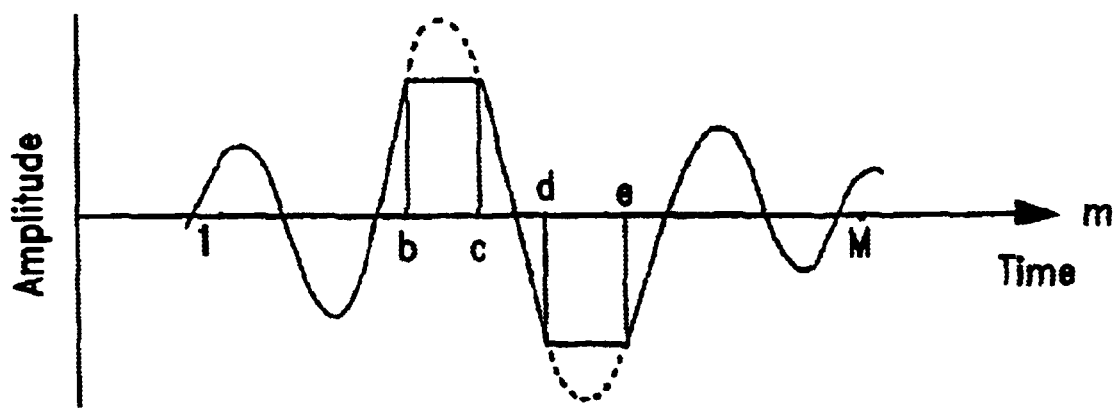

Referring to the drawings and in particular to FIG. 1(a), a waveform as depicted is discontinuous in that it lacks data from b to c; and d to e. Also, a waveform as shown in FIG. 1(b) has its positive and negative peaks clipped from b to c and d to e, respectively.

Assuming that the above-mentioned interval R is from m=1 to M but excludes the missing or clipped portions, the original waveform W(m), which includes segments as indicated by broken lines, can be represented by synthesizing the above-mentioned first to n-th sinusoids. If the W(m) is an almost periodic function which can be represented by synthesis of a definite number of sinusoids, the difference between W(m) and the synthesized waveform is:

$$\left| W(m) - \sum_{K=1}^{N} S(m, T_k) \right| \leq \varepsilon \qquad \text{Equation 17}$$

where ε>0 and approaches zero as N becomes greater.

The k-th sinusoid is:

$$S(m, T_k) = X(T_k)\sin(2\pi m/T_k) + Y(T_k)\cos(2\pi m/T_k) \qquad \text{Equation 18}$$

Assuming that $X(T_k)$ and $Y(T_k)$ are values which are derived by replacing W(m) in Equations 1, 2, 6 and 7 with a (k−1)th residual waveform, R(m; $T_1$, $T_2$, ..., $T_{k-1}$), it is possible to restore the original waveform with greater accuracy by correcting the missing or clipped portions of W(m) using the corresponding portions b to c and d to e of the synthesized waveform. It should be understood that it is also possible to predict the waveform W(m) by extrapolating the synthesized waveform for a region m>M.

Figure 2A:
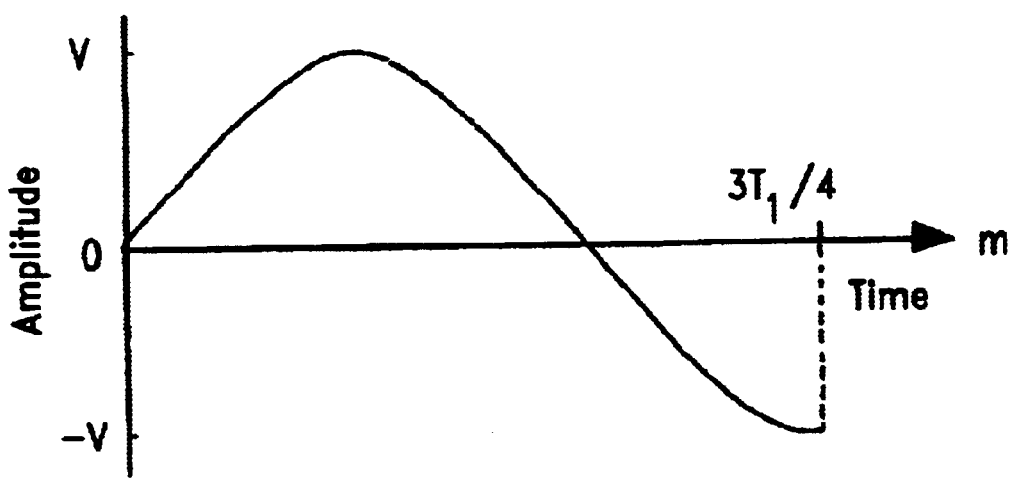
FIGS. 2(*a*), 2(*b*) and 2(*c*) show intervals of a waveform to be analyzed that are ¾, ¼ and less than ¼, respectively, of the period in length.

In conventional frequency analyses using Fourier transformation, the maximum period and the minimum frequency for analysis are M and 1/M, respectively, where M is the length of an interval of the wave data to be analyzed. It should be noted, however, that there are no such limitations on the non-harmonic frequency analysis according to the present invention, as shown by way of examples by the calculations given below:

(1) Referring to FIG. 2(a) in which the wave data W(m) is shown as given in a ¾ period, the five summation values as derived by the above Equations 1 to 5 where T=$T_1$ are:

$p(T_1)=3TV/8;$ $q(T_1)=TV/4\pi;$ $A(T_1)=B(T_1)=3T/8;$ and $D(T_1)=T/4\pi.$

Accordingly, using Equation 7 gives $X(T_1)$=V and $Y(T_1)$=0. In this case, the residual quantity is a minimum or 0.

Figure 2B:
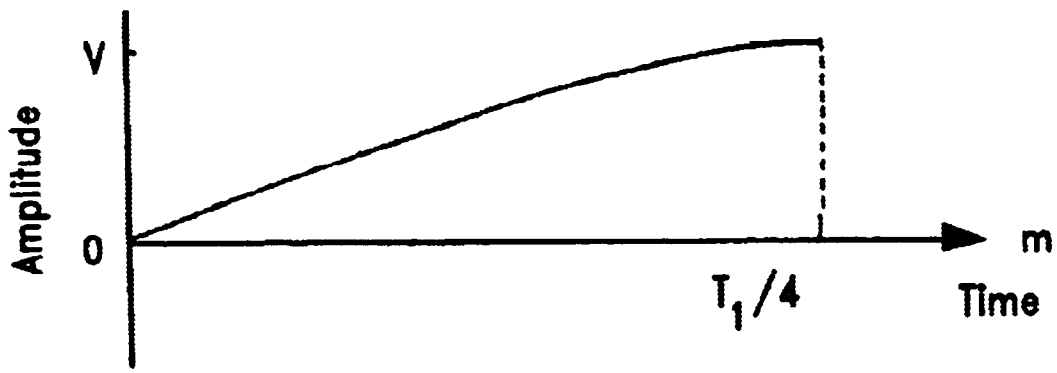

(2) Referring to FIG. 2(b) in which the wave data W(m) is shown as given in a ¼ period, the five summation values as derived by the above Equations 1 to 5 where T=$T_1$ are:

$p(T_1)=TV/8;$ $q(T_1)=TV/4\pi;$ $A(T_1)=B(T_1)=T/8;$ and $D(T_1)=T/4\pi.$

Accordingly, using Equation 7 gives $X(T_1)$=V and $Y(T_1)$=0. In this case, the residual quantity is a minimum or 0.

Figure 2C:
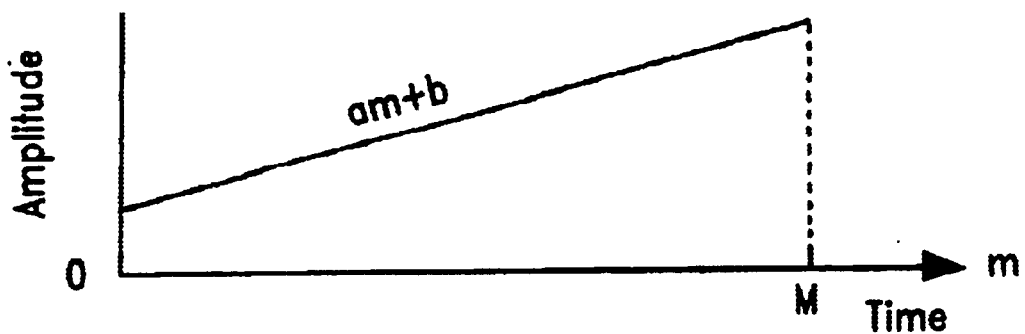

(3) Referring to FIG. 2(c) in which the wave data W(m) is shown as given in less than the ¼ period, the five summation values as derived by the above Equations 1 to 5 where T>>M are:

$p(T) \cong (2\pi/T)^2 aM^3/3 + (2\pi/T)bM^2/2$ $q(T) \cong aM/2 + bM$ $A(T) \cong (2\pi/T)M^3/3$ $B(T) \cong M^3$ $D(T) \cong (2\pi/T)M^2/2 \qquad \text{Equation 19}$ Accordingly, using Equation 7 gives X(T)=a T/2π and Y(T)=b. The synthesized waveform is:

$X(T)\sin(2\pi m/T) + Y(T)\cos(2\pi m/T) \cong am+b=W(m) \qquad \text{Equation 20}$ Accordingly, the residual quantity approaches zero if T becomes greater.

It should be noted that in the above calculations, the summations were derived through integration. This does not make any essential difference, however, as it depends upon quantization errors.

Experiments have shown that the present non-harmonic waveform analysis can provide excellent results in permitting an accurate restoration and extrapolation of the original waveform.

Referring to FIG. 3(a), the waveform W(m) as shown is comprised of five sinusoids. The waveform W(m) was subjected to the present non-harmonic waveform analysis for m=1 to 512 to derive the five sinusoids. These five sinusoids were then synthesized and extrapolated for m>512. The result is then waveform as shown in FIG. 3(b). To further show the excellence of the present non-harmonic waveform analysis, results of spectral analyses of the waveform W(m) of FIG. 3(a), the synthesized and extrapolated waveform of FIG. 3(b) and the waveform as synthesized using the conventional FFT for m=1 to 512 are shown in FIGS. 3(c), 3(d) and 3(e), respectively.

Experiments also have shown that the present non-harmonic waveform analysis is less susceptible to influences by noises.

Referring to FIG. 4(a), there is shown the waveform W(m) of FIG. 3(a) added with white noise. This noise-ridden waveform should be contrasted with that of FIG. 4(b)

which is the result of synthesizing the five sinusoids as derived by using the present non-harmonic waveform analysis for m=1 to 512 and of extrapolating them for m>512, as previously described in conjunction with FIG. 3(b). FIGS. 4(c), 4(d) and 4(e) are spectrograms similar to FIGS. 3(c), 3(d) and 3(e), respectively, and show that the present non-harmonic waveform analysis is significantly superior to the conventional FFT in removing adverse effects of noises.

In performing the present non-harmonic waveform analyses, the results of which are shown in FIGS. 3(a) to 3(e) and FIGS. 4(a) to 4(e), the period T was given as an integer equal to 2 to 128. As a result, the five sinusoids were derived with their periods equal to 121; 67; 37; 29; and 23. By way of comparison, the periods of the five sinusoids which comprise the waveform W(m) of FIGS. 3(a) and 4(a) are 120; 67; 37; 29; and 23.

Generally, the period at which the residual quantity is a local minimum can be determined in the following manner:

Assuming that a series of arbitrary periods T are $u_1$, $u_2, \ldots, u_p$, a plurality of bands each comprised of a set of k periods are defined, starting with a first band comprised of periods $u_1$ to $u_k$, a second band comprised of periods $u_{k+1}$ to $U_{2k}, \ldots$, and the like. For each band, the period at which E(T) in Equation 10 is a local minimum is determined. If the period where the minimum obtained is located adjacent an end of the band, the band is combined with its adjacent band and the period at which E(T) is a minimum is determined for the two adjacent bands.

Figure 5:
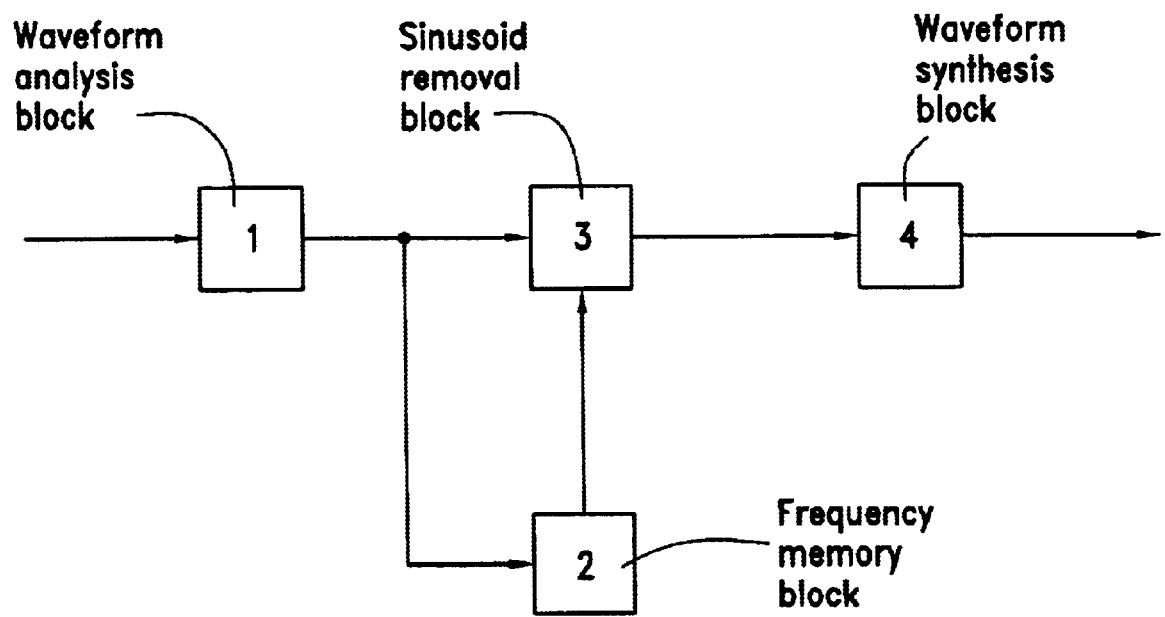
FIG. 5 is a block diagram of an embodiment for removing steady-state noise from an audio signal according to the present invention.

Referring to FIG. 5, there is shown a block diagram of an embodiment which utilizes the present non-harmonic waveform analysis to remove steady-state noise from an audio signal.

It is generally known that the spectral distribution of an audio signal changes with time. Accordingly, if an audio waveform is segmented every 20 to 30 ms. and then each segment is subjected to the present non-harmonic waveform analysis to derive sinusoids, the probability that the sinusoids as derived from different segments having identical frequencies is very low unless echoes exist. Removal of steady-state noise is made possible by utilizing this non steady-state nature of audio waveforms.

As shown in FIG. 5, reference numeral 1 designates a waveform analysis block where each segment of an audio waveform is subjected to the present non-harmonic waveform analysis to obtain parameters which are determinative of sinusoids as detected. Although not shown, the audio waveform is divided into segments of approximately 20 ms. in length prior to undergoing the non-harmonic analysis. The parameters as obtained include the amplitude $X(T_k)$ of sine functions, the amplitude $Y(T_k)$ of cosine functions, the period $T_k$ or the frequency $fk=1/T_k$. These parameters are fed to a frequency memory block 2 as well as to a sinusoid removal block 3. The sinusoid removal block 3 operates in response to the output of the frequency memory block 2 by removing only those sinusoids whose frequencies are in match with the sinusoids occurring in one immediately previous segment. The remaining sinusoids, which pass through the sinusoid removal block 3, are fed to a waveform synthesis block 4 for subsequent synthesis and output of the input waveform.

As described above, due to the non steady-state nature of the audio waveform, it is very improbable that sinusoids of an audio waveform are removed at the sinusoid removal block 3. However, if the audio waveform contains steady-state noise or sound whose spectral distribution does not vary significantly as compared to voice, such noise or sound would be removed just like when echoes exist.

Figure 6:
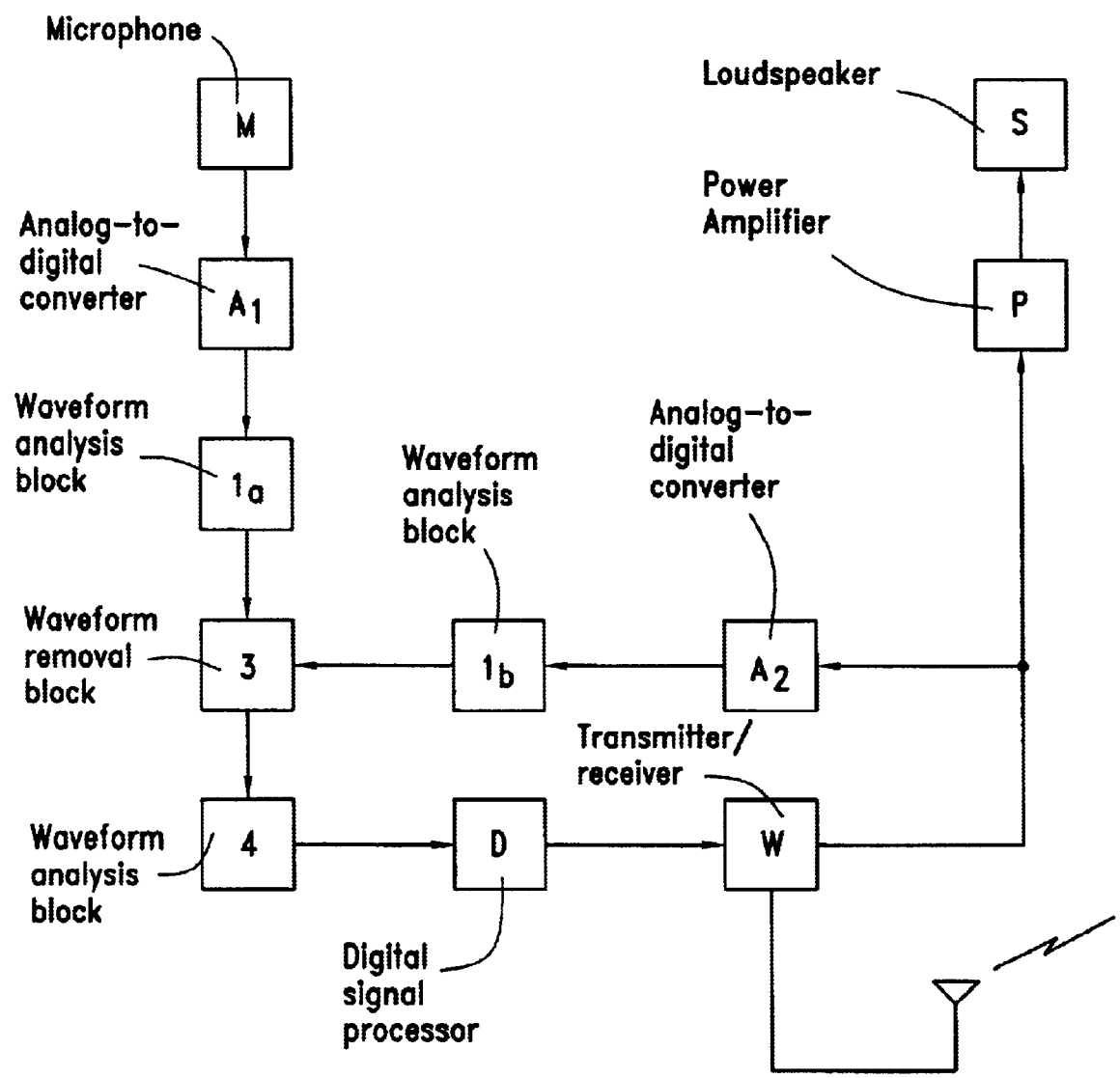
FIG. 6 is a block diagram of a hands-free telephone system with means to prevent howling and echoes according to the present invention.

Referring to FIG. 6, there is illustrated a block diagram of an automotive hands-free telephone system which utilizes the present non-harmonic waveform analysis to remove undesirable noise. As shown, a microphone M sends a speech signal to an analog-to-digital converter $A_1$ and the resulting converter output is divided into segments of a predetermined length, e.g., 20 ms, for application to a waveform analysis block $1_a$. In the waveform analysis block $1_a$, each segment is subjected to the present non-harmonic waveform analysis to derive certain parameters of sinusoids contained in each segment, such as the amplitude of sine functions, the amplitude of cosine functions, the period or frequency.

The telephone system includes a transmitter/receiver W connected to an antenna. The receiver portion of W receives a transmitted speech signal via the antenna and applies the signal as received to another analog-to-digital converter $A_2$ as well as to a power amplifier P. The power amplifier is connected to a loudspeaker S. The digital output of the analog-to-digital converter $A_2$ is divided into segments of the predetermined length, e.g., 20 ms., and each segment is applied to another waveform analysis block $1_b$ to subject it to the present non-harmonic waveform analysis. The parameters of sinusoids contained in each waveform segment, as derived by the analysis, include the frequency or period.

The parameter outputs from the waveform analysis blocks $1_a$ and $1_b$) are applied to a waveform removal block 3. If any sinusoids from $1_a$ have the same frequencies as those from $1_b$, the waveform removal block 3 operates to block passage of parameters associated with such frequency-matched sinusoids from the waveform analysis block $1_a$ to a waveform synthesis block 4. Based on the remaining parameters received from the waveform removal block 3, the waveform synthesis block 4 functions to synthesize the waveform of the speech signal from the microphone M. By so doing, sounds emitted from the loudspeaker S into the microphone M due to coupling therebetween are removed thus preventing occurrence of howling or echoes. The present non-harmonic waveform analysis is particularly suited for use in a hands-free telephone system for automotive use because it is not susceptible to varying transmission characteristics between the loudspeaker and the microphone and also because extraneous noise and double-talk do not cause any malfunctioning. In one embodiment of the present telephone system, the waveform analysis blocks $1_a$ and $1_b$, the waveform removal block 3 and the waveform synthesis block 4 were implemented by a digital signal processor DSP56301 commercially available from Motorolla, Inc. For an audio signal having a bandwidth of 250 Hz to 4 kHz, the interval for analysis used was 32 ms. Each frame or interval of the audio waveform was converted into 256 data samples which were subjected to the present non-harmonic analysis using 256 frequencies. Forty sinusoids were detected and the time required for processing was approximately 20 ms.

Figure 7:
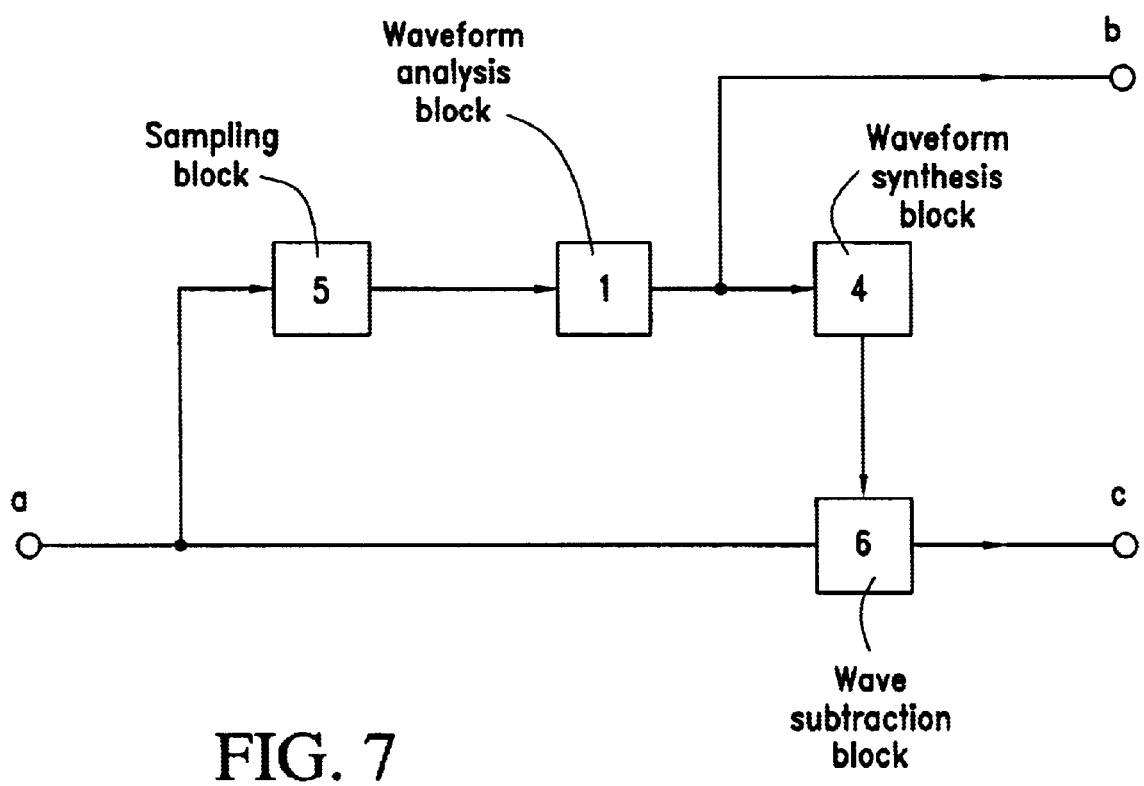
FIG. 7 is a block diagram of an embodiment for effecting bandwidth compression according to the present invention.

Referring to FIG. 7, there is illustrated a block diagram of a further embodiment which utilizes the present non-harmonic waveform analysis for purposes of signal bandwidth compression.

As is generally known, an audio signal or an image signal has higher power for lower frequency components. Accordingly, if such lower frequency components can be converted into parameters determinative of sinusoids which comprise the components, transmitting or recording such parameters in place of the lower frequency components per se would result in a significant reduction in signal bandwidth.

The present non-harmonic waveform analysis is particularly suitable for analysis of the image signal because it contains low frequency components whose periods are longer than the length of the wave data W(m) as mentioned above. Generally, in the analysis of lower frequency components, it is advantageous to use "down sampling" at a frequency lower than a predetermined sampling frequency F because the amount of calculations becomes less. However, this down sampling requires a lowpass filter to remove noise due to aliasing. Since the use of such a lowpass filter requires the wave data W(m) to be sufficiently longer than a desired cutoff period, however, the down sampling is not compatible with the analysis of the image signal. The present non-harmonic waveform analysis does not suffer from the above-noted disadvantage resulting from using the lowpass filter, since it can utilize "random sampling(down sampling at random intervals)" to suppress aliasing noise without use of the lowpass filter.

As shown in FIG. 7, the wave data W(m) appealing at an input terminal a is supplied to a sampling block 5 where it is subjected to random down sampling prior to undergoing the present non-harmonic waveform analysis. The output of the sampling block 5 is fed to a waveform analysis block 1 which in turn subjects digital samples resulting from the random sampling to the present non-harmonic waveform analysis. The resulting parameters, such as $X(T_k)$, $Y(T_k)$ and $T_k$, of sinusoids as detected are fed to a parameter output terminal b as well as to a waveform synthesis block 4. In the waveform synthesis block 4, the parameter input from the waveform analysis block 1 is used to derive sinusoids and accordingly waveforms of lower frequency components through synthesis. The synthesized waveforms are then supplied to a waveform subtraction block 6 which also receives the wave data W(m) from the input terminal a. The waveform subtraction block 6 operates to subtract the synthesized waveforms from the input wave data W(m), resulting in a residual waveform R(m) to be fed to an output terminal c. It should be noted that a combination of the parameter values at the parameter output terminal b and the residual waveform R(m) at the output terminal c enables a complete restoration of the original wave data. Accordingly, ti should be noted that the present non-harmonic waveform analysis has the significant advantage of reducing the necessary bandwidth (or bit number) to transmit or record wave data.

Assuming that the wave data $W_k(m)$ represents a k-th line of a horizontal image signal, the $W_k(m)$ is subjected to the present non-harmonic waveform analysis to derive n sinusoids of lower frequencies, $S_k(m, T_j)$ (j=1, 2, ..., N). The resulting residual waveform $R_k(m)$ is:

$$W_k(m) = \sum_{j=1}^{N} S_k(m, T_j) + R_k(m) \quad \text{Equation 21}$$

By appropriate selection of N, the power of the $R_k(m)$ can be made sufficiently smaller than the power of $W_k(m)$. The parameters of each sinusoid can be expressed as $X(T_j)$, $Y(T_j)$, and $T_j$. Accordingly, it is possible to effect bandwidth compression by transmitting $R_k(m)$ and N sets of parameters instead of $W_k(m)$.

Also, it should be noted that a greater bandwidth compression can be accomplished if the following equation regarding wave data from the k-th to (k+g)th lines of the horizontal image signal, i.e., $W_k(m)$, $W_{k+1}(m)$, ..., $W_{k+g}(m)$, holds for a small value of d:

$$\sum_{m=1}^{M}[W_{k+h}(m) - W_k(m)]^2 / \sum_{m=1}^{M}[W_k(m)]^2 < \quad \text{Equation 22}$$

$$d < 1 (h = 1, 2, \ldots, g)$$

If the above equation holds, the lower frequency components of the wave data of the (k+1)th to (k+g)th lines can be replaced with the wave data of the k-th line and the N sets of parameters. Accordingly, the transmission of the N sets of parameters and the residual waveform $R_k(m)$ of each line results in a further bandwidth compression. In case where dynamic picture images are transmitted, the application of the above-described signal processing to wave data of the same lines of different frames will provide for a much greater bandwidth compression.

Figure 8:
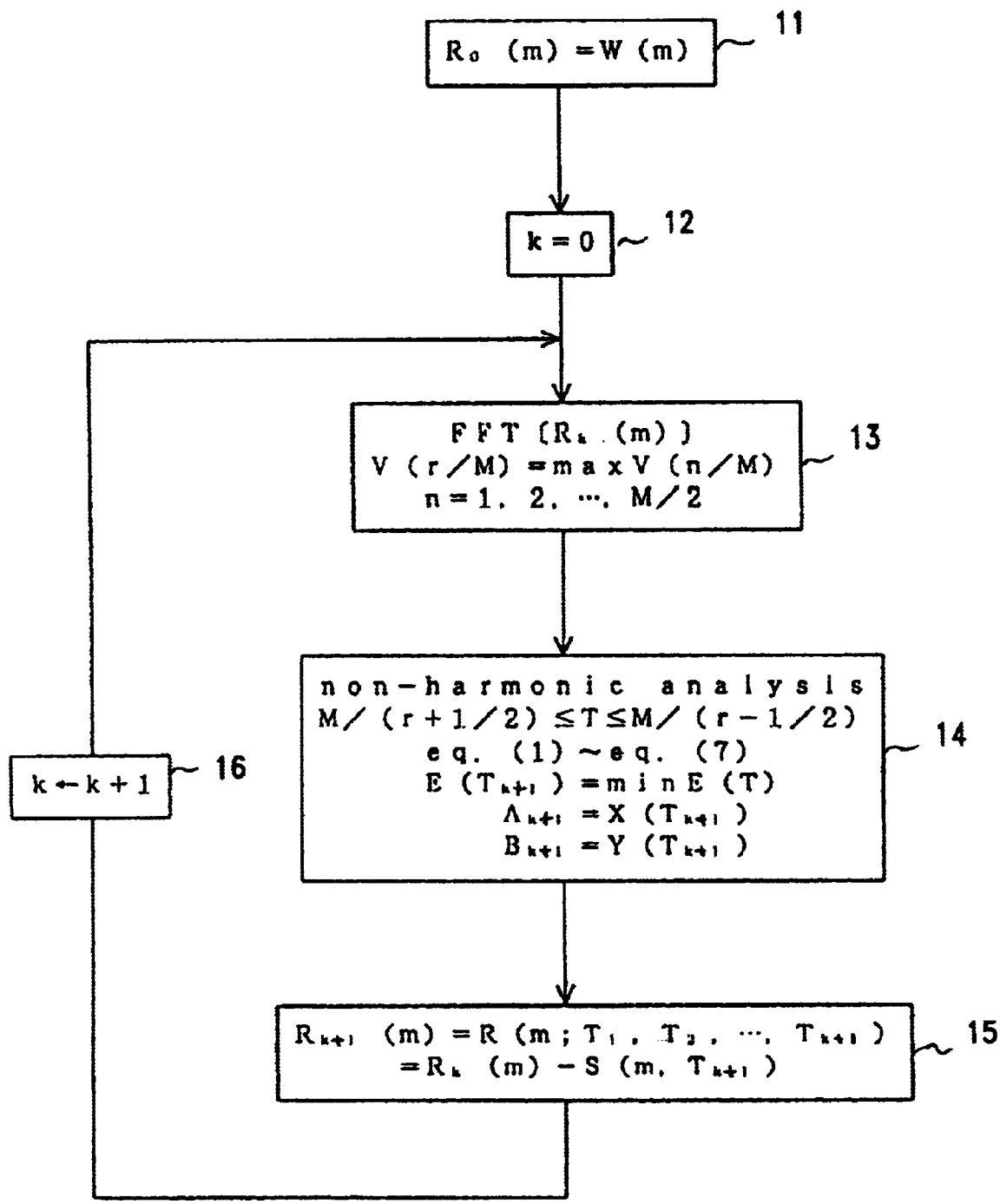
FIG. 8 is a flow chart of a signal processing routine using FFT as well as the present non-harmonic waveform analysis.

Referring to FIG. 8, there is shown a flow chart of a waveform analysis routine which utilizes the fast Fourier transform (FFT) for preprocessing to reduce the time required for analysis. As shown, the routine inputs a discrete waveform W(m) at 11. The discrete waveform W(m) is shown as $R_0(m)$ because $R_k(m)=R_0(m)$ when k=0 at 12. The next step 13 is the waveform preprocessing by FFT where the input waveform data $R_k(m)$ is subjected to FFT to derive a set of power spectra V(n/M) of different magnitudes, from which the power spectrum V(r/M) of the maximum magnitude is determined. Then, at 14, the routine applies the present non-harmonic waveform analysis to the results of the FFT preprocessing to narrow down the period $T_{k+1}$ at which the residual quantity E(T) is a local minimum. This is accomplished by performing calculations on Equations 1 to 7 for periods in the neighbourhood of M/r, or for M/(r+½) ≤T≤M/(r−½), by varying the period T with a small step.

Once the period $T_{k+1}$ is derived, the amplitude $X(T_{k+1})$ of a sine function and the amplitude $Y(T_{k+1})$ of a cosine function are obtained. $A_{k+1}=X(T_{k+1})$; and $B_{k+1}=Y(T_{k+1})$. Thus, these data, $T_{k+1}$, $A_{k+1}$, and $B_{k+1}$, are stored as the specific parameters determinative of the (k+1)th sinusoid. At 15, the waveform data $R_{k+1}(m)$ is derived by subtracting the (k+1)th sinusoid, $S(m, T_{k+1})$, from the waveform data $R_k(m)$. Then, at 16, k is incremented to k+1. Thus, the waveform data $R_{k+1}(m)$ is subjected to the same analyses as described above to detect a (k+2)th sinusoid. This analysis will be repeated a predetermined number of times or until the residual quantity reaches a predetermined value. In one implementation of this waveform analysis routine, a personal computer manufactured by Micron, Inc. under the model name MILLENIA was used. The personal computer included a "Pentium" CPU and the software used was MATLAB FOR WINDOWS. A wave data under test was converted into 512 digital samples and the resolution for analysis was equivalent to 1/256 octave-band. Approximately 2.4 seconds were needed to detect sixteen frequencies.

Figure 9:
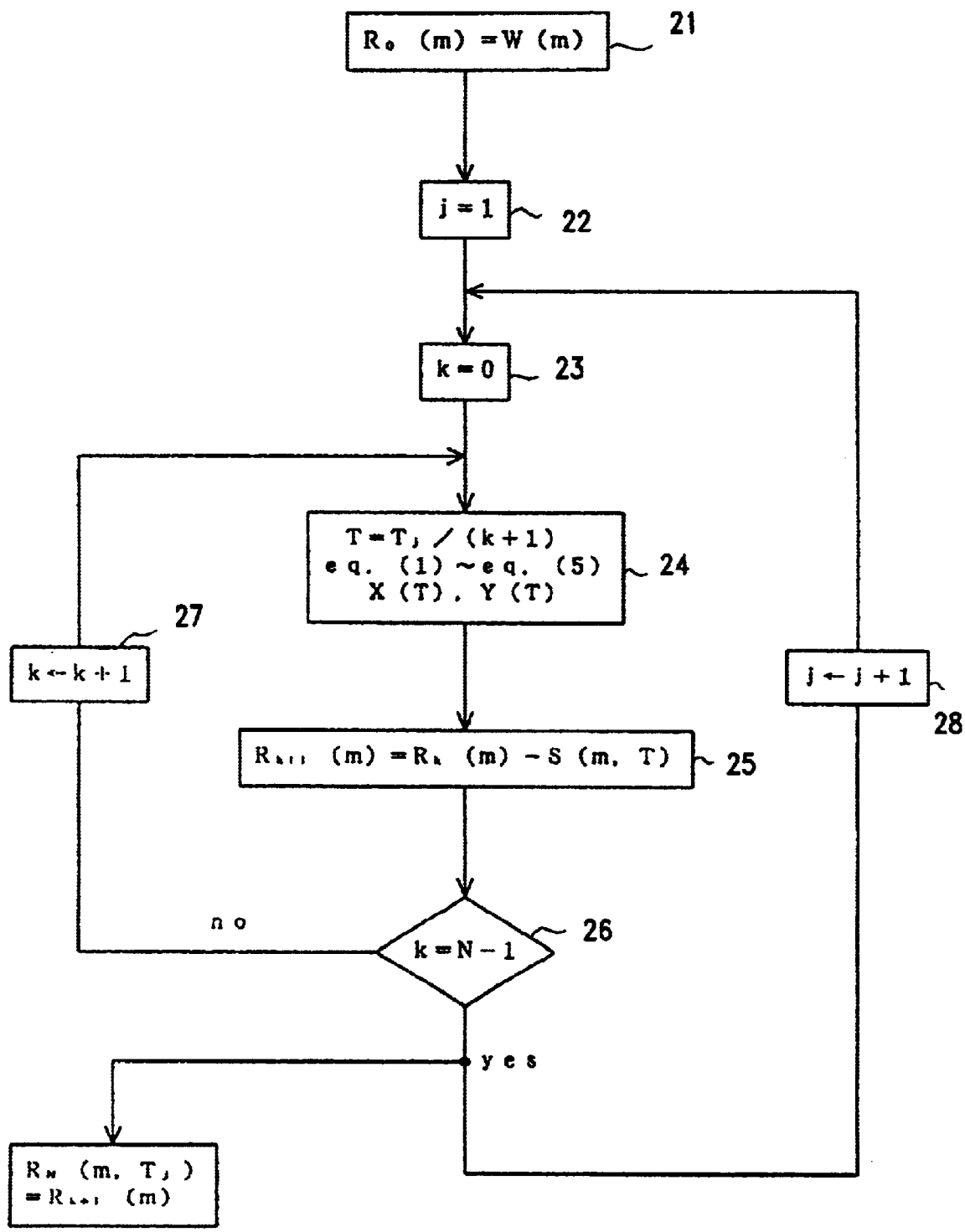
FIG. 9 is a flow chart of a routine for determining the pitch period of a harmonic waveform using the present non-harmonic waveform analysis.

Referring to FIG. 9, there is shown a flow chart of a routine for determining the pitch period of a harmonic waveform using the present non-harmonic waveform analysis. As shown, the routine inputs a discrete waveform W(m) at 21. At 22, a first fundamental period $T_1$ is specified for use in the analysis by setting j=1. The discrete waveform W(m) is shown as $R_0(m)$ because $R_k(m)=R_0(m)$ when k=0 at 23. The next step 14 is the present non-harmonic waveform analysis which is performed to derive the amplitude X(T) of a sine function and the amplitude Y(T) of a cosine function. When j=1, $T=T_1$ and this is applied to Equations 1 to 5 to obtain X(T) and Y(T), from which a sinusoid S(m, T) is derived. At 25, the wave data $R_1(m)$ is derived by subtracting the sinusoid $S(m, T)$ from $R_0(m)$. The routine checks at 26 as to whether k has reached N−1. If not, k is incremented to k+1 at 27. Then, a sinusoid with a harmonic period T/(k+1) is derived by following the steps 24 to 27 sequentially. If k has reached N−1, as determined at 26, a residual waveform $R_N(m, T_1)$ is derived by removing up to an N-th harmonic waveforms having a fundamental period $T_1$. Then, at 28, j is incremented from 1 to 2, and a residual waveform $R_N(m, T_2)$ is derived by subtracting up to an N-th harmonic waveforms having a fundamental period $T_2$ from $R_0(m)$ by following the same steps 24 to 25 sequentially. Although not specifically shown in the flow chart, after such residual waveforms have been obtained for all the fundamental periods $T_j$ given, a determination is made as to which fundamental period $T_j$ renders the power of the residual waveform a local minimum. Such fundamental period as determined is the true fundamental period.

It should be noted that, as is clear from Equation 10, the power of the sinusoid becomes a local maximum at the particular period where the power of the residual waveform is a minimum. Accordingly, if T<M, the period at which the residual quantity becomes a minimum can be approximated to the period at which the sum of squared X(T) and squared Y(T) is a maximum.

While specific embodiments of the invention have been described in detail, it will be appreciated by those skilled in the art that various modifications and alternatives to those details could be developed in light of the overall teachings of the disclosure. Accordingly, the particular method disclosed is meant to be illustrative only and not limiting as to the scope of invention which is to be given the full breadth of the claims appended and any and all equivalents thereof.

I claim:

1. A method for performing a non-harmonic frequency analysis for an arbitrary interval of a discrete waveform, comprising the steps of:

generating first product values which are non-harmonic of a discrete waveform by multiplying the discrete waveform to be analyzed by a sine function having an arbitrary period over an arbitrary interval of the discrete waveform;

providing first summation values by summing the first product values over said arbitrary interval of the discrete waveform;

generating second product values which are non-harmonic of the discrete waveform by multiplying the discrete waveform to be analyzed by a cosine function having said arbitrary period over said arbitrary interval of the discrete waveform;

providing second summation values by summing the second product values over said arbitrary interval of the discrete waveform;

generating third product values by multiplying the sine function and the cosine function together over said arbitrary interval of the discrete waveform;

providing third summation values by summing the third product values over said arbitrary interval of the discrete waveform;

providing first square values which are non-harmonic by squaring the sine function over said arbitrary interval of the discrete waveform;

providing fourth summation values by summing the first square values over said arbitrary interval of the discrete waveform;

providing second square values which are non-harmonic by squaring the cosine function over said arbitrary value of the discrete waveform;

providing fifth summation values by summing the second square values over said arbitrary interval of the discrete waveform;

providing an associated residual waveform by subtracting each sinusoid of a plurality of sinusoids contained in the discrete waveform based on said first to fifth summation values to provide an associated residual waveform; and checking the associated residual waveform to see if the power of the associated residual waveform becomes a local minimum by varying said arbitrary period.

2. The method as defined in claim 1, wherein each sinusoid of said plurality of sinusoids is orthogonal to an associated residual waveform.

3. A method for performing a non-harmonic frequency analysis for a discrete waveform comprised of a plurality of sinusoids, said method comprising the steps of:

deriving a first sinusoid from a discrete waveform, said first sinusoid having an arbitrary period which represents a local maximum in power;

providing a first associated residual waveform associated with the first sinusoid by subtracting the first sinusoid from said discrete waveform;

deriving a second sinusoid from said first associated residual waveform said second sinusoid having another arbitrary period which represents a local maximum in power;

providing a second associated residual waveform associated with the second sinusoid by subtracting the second sinusoid from said first associated residual waveform; and successively performing the above-defined deriving steps and the providing steps by subtracting steps so as to derive a plurality of sinusoids, each sinusoid of said plurality of sinusoids as derived being orthogonal to the associated residual waveform.

\* \* \* \* \*